United States Patent [19]

Wilson et al.

[11] Patent Number: 4,653,428
[45] Date of Patent: Mar. 31, 1987

[54] SELECTIVE CHEMICAL VAPOR DEPOSITION APPARATUS

[75] Inventors: Ronald H. Wilson; Robert W. Stoll, both of Schenectady; Michael A. Calacone, Watervliet, all of N.Y.

[73] Assignee: General Electric Company, Schenectady, N.Y.

[21] Appl. No.: 733,445

[22] Filed: May 10, 1985

[51] Int. Cl.⁴ ............................................. C23C 16/00
[52] U.S. Cl. .................................. 118/725; 118/50.1; 118/641; 118/724
[58] Field of Search ............... 118/725, 724, 50.1, 118/641

[56] References Cited

U.S. PATENT DOCUMENTS

| | | | |
|---|---|---|---|
| 3,042,494 | 7/1962 | Gutsche | 118/725 X |
| 3,460,510 | 8/1969 | Currin | 118/725 |
| 3,627,590 | 12/1971 | Mammel | 118/725 X |
| 3,659,552 | 5/1972 | Briody | 118/725 |
| 3,916,822 | 11/1975 | Robinson | 118/725 |
| 4,041,278 | 8/1977 | Boah | 118/724 X |
| 4,258,658 | 3/1981 | Politycki et al. | 118/719 |
| 4,435,445 | 3/1984 | Allred et al. | 427/54.1 |
| 4,496,609 | 1/1985 | McNeilly et al. | 427/55 |
| 4,550,684 | 11/1985 | Mahawili | 118/641 X |

Primary Examiner—Bernard D. Pianalto
Attorney, Agent, or Firm—James Magee, Jr.; James C. Davis, Jr.

[57] ABSTRACT

An apparatus is provided for selectively depositing metal films on metal and semiconductive surfaces of a substrate wherein the depositing surface of the substrate is isolated from undesired impinging radiation, such as infrared radiation.

18 Claims, 3 Drawing Figures

SELECTIVE CHEMICAL VAPOR DEPOSITION APPARATUS

BACKGROUND OF THE INVENTION

The present invention relates generally to a chemical vapor deposition apparatus and process. More particularly, it relates to a chemical vapor deposition apparatus characterized by the selective formation of metal films on metal and semiconductor surfaces of a substrate, such as a patterned silicon wafer and a method for its use.

There is a continuous trend in the development of solid state circuitry to reduce the dimensions of devices in integrated circuits and in this way increase the speed of operation. As the dimensions of devices on substrates such as silicon wafers continues to shrink, the contact openings in insulating layers to conductors and semiconductors become smaller and the lateral dimensions of these openings approach the dimension normal to the surface, thus requiring steep sides for these openings to accommodate close packing and achieve the high density required. Coverage of the steep sides of the contact openings by the succeeding conductor becomes difficult and the recessed surface of these openings makes lithography for subsequent layers difficult.

The need is recognized for improvement in formation of conductive films in these close packed contact openings on silicon wafers. A solution to this problem will be to grow a metal selectively on the conductor and semiconductor surfaces by chemical vapor deposition. However, to deposit thick films of metals, one must use a reducing atmosphere, such as hydrogen, to react with the depositing gas. Selective deposition is difficult under these conditions. For example, to obtain tungsten films greater than 500 Angstroms thick, it is necessary to react tungsten hexafluoride with hydrogen. Selectivity is lost by such a reaction and tungsten growth on insulator surfaces occurs after about 1000 Angstroms of growth on the conductor surfaces, as disclosed by Saraswat et al, in *Selective CVD of Tungsten for VLSI Technology*, Stanford University, May 1984.

The selectivity of metal deposition is known to be dependent on the deposition process conditions including temperature, pressure and reactant concentration in addition to the composition of the substrate surface. These reaction variables can be controlled within conventional chemical vapor deposition reactors. The apparatus and process of this invention provide enhanced selectivity of metal deposition by controlling an additional variable, i.e., the radiation which impinges upon the depositing surfaces of the substrate.

SUMMARY OF THE INVENTION

The chemical vapor deposition apparatus of this invention includes the improvement which is a means for isolating the depositing surfaces of a substrate from undesirable radiation. Such means may include, for example, filters or reflectors positioned to protect the substrate, such as a silicon wafer, from undesirable radiation. The apparatus of this invention enhances the selective vapor deposition of metals on metal and semiconductor surfaces of a substrate by controlling the radiation which impinges on the depositing surface.

The process of this invention is directed to a method of selectively depositing metal films on a substrate by heating a substrate to a temperature above about 200° C. within a reaction chamber with radiant energy without appreciable absorption of radiant energy by the reaction chamber walls. The heated substrate is then contacted with a gaseous reactant to form a metal film on the depositing surface, the metal is preferably selected from molybdenum and tungsten. The depositing surface of the substrate is isolated from a substantial portion of impinging infrared radiation within the reactor during contact with the gaseous reactant.

OBJECTS OF THE INVENTION

An object of the present invention is to provide a method and apparatus for selectively depositing thick metal films on metal and semiconductor surfaces. Another object of the present invention is to provide a method and apparatus which will deposit tungsten selectively at a thickness above 1000 Angstroms on a patterned substrate containing metal surfaces, semiconductor surfaces or both.

Other objects will be apparent from the detailed description which follows.

DETAILED DESCRIPTION OF THE PREFERRED EMBODIMENTS

Figure 1:
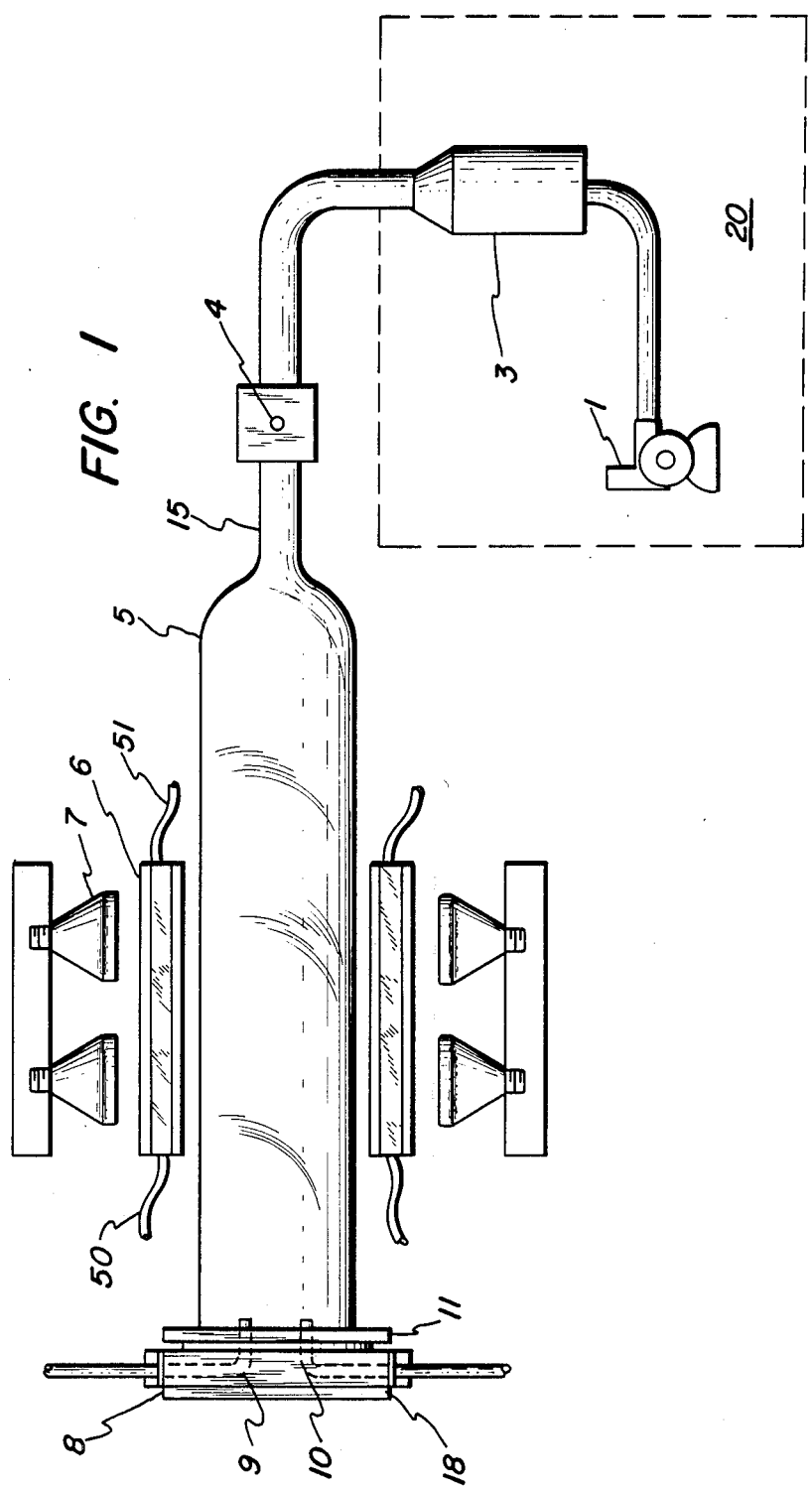
FIG. 1 is a schematic representation of a chemical vapor deposition apparatus of this invention which utilizes a filament lamp energy source.

The present invention provides a chemical vapor deposition process and apparatus which enhances the selective deposition of metal films on substrates, such as silicon wafers commonly employed in the electronics industry in the manufacture of integrated circuits, transistors, and the like. The term "selective deposition" utilized herein and in the claims refers to deposition on particular materials of a substrate to the exclusion of dissimilar materials of that substrate such as, for example, the deposition on metal and/or semiconductor surfaces to the exclusion of deposition on insulator surfaces of a substrate. The substrate may be glass, a silicon wafer or other suitable material. The most common are electronic devices having patterned metal and semiconductor surfaces thereon such as integrated circuits. The apparatus of this invention is capable of depositing a wide variety of metal and semiconductor containing gases on such surfaces, including metal carbonyls, metal fluorides, silane and germane. The apparatus is adaptable to all chemical vapor deposition processes. However, the process of this invention is directed to the deposition of metal films selectively, such as tungsten and molybdenum. While in some cases, it is desirable to produce a selective film having a thickness in the tens of Angstroms, the films produced by the method and apparatus of this invention can have a thickness above one micron, particularly where metals are deposited.

Several embodiments of the apparatus comprising this invention are disclosed herein. Each of such embodiments employs the same basic concepts characteristic of the improved features of this apparatus, namely the use of a means for isolating the depositing surface of a substrate from undesired radiation. A common element in all embodiments of the apparatus is the use of a cold-wall reaction chamber or reactor, which helps achieve the objectives of this invention. The process of this invention also incorporates operating conditions which are characteristic of cold-wall reactors.

The terms "cold-wall reaction chamber" and "cold wall reactor", as used herein, refer to a system wherein only the substrates and/or the surface on which the substrates are placed are heated to the reaction temperature within the reaction chamber. In a "hot-water reactor", the entire reaction chamber is heated to the reaction temperature, typically by a resistance heater wrapped around the chamber. In a cold-wall reaction chamber, the chamber walls remain unheated during the reaction, particularly those walls which face the depositing surface of the substrate. By maintaining the reaction chamber walls in an unheated state, such walls receive little or no film deposition during substrate coating. Therefore, the reactant gases are not depleted. By utilizing a cold-wall reactor, the radiation which impinges upon the substrate is controlled more easily.

A common cold-wall system utilizes radio frequency (RF) induction heating to heat a conducting susceptor positioned within the reaction chamber, the walls of which are formed of a non-conducting or insulating material to RF. The substrate is then heated by radiant energy emitted from the susceptor. For example, an external RF generator will transmit energy to a graphite susceptor within a quartz reaction chamber which, in turn, heats substrates positioned thereon, such as silicon wafers. The RF energy used typically has a frequency in the order of 5 KHz to 500 KHz.

In other embodiments of the apparatus, a radiant energy source is used to heat the substrate directly and/or a susceptor positioned within the reaction chamber. The walls of the reaction chamber are transparent to the radiant energy transmitted, which is predominantly short wave length radiation within the visible light or ultraviolet light range. The radiant energy source can be one or more incandescent lamps positioned about the quartz reaction chamber. Such an embodiment is more particularly described by McNeilly et al, in U.S. Pat. No. 4,496,609, the contents of which are incorporated herein by reference.

Another embodiment is one in which a resistance heater is used within the reaction chamber to heat substrates directly. Only the non-depositing surfaces of the substrates contact the resistance heater. The depositing surfaces of the substrates are protected from radiation emitted by the resistance heater by such means as filters and reflectors positioned within the reactor. Since the source of undesirable radiation is limited in such a configuration, impingement of such radiation upon the depositing surfaces of the substrates can be controlled. Therefore, although this configuration resembles a "hot-wall reactor" it falls within the scope of this invention.

The apparatus and method of this invention are not limited by the configuration or dimensions of the reaction chamber. They encompass the several different types of reactor configurations which have evolved to meet selective requirements of chemical vapor deposition. Among those presently utilized are the horizontal, vertical, cylindrical, and tubular systems. In the horizontal system, silicon wafers are typically processed lying flat or on a moving belt in a continuous process furnace. The vertical reactor typically employs a vessel, such as a bell jar, in which the wafers are placed on a susceptor disc which rotates continually for uniform coverage. The tubular and cylindrical reactors are similar to the horizontal system with the wafers being peripherally mounted in the cylindrical system and multitiered carriers being used in the tubular system.

A conventional chemical vapor deposition apparatus, upon which the apparatus of this invention is based, comprises: (1) means for transporting the reactant gases to the substrate surface which permits absorption of the reactants on the surface and (2) means for heating the surface of the substrate to permit reaction of the absorbed reactants. The chemical deposition procedures within the reaction chamber of this invention are very similar to those employed by known coating procedures, the primary distinction being that undesired radiation does not impinge the depositing surface. The apparatus of this invention is suitable for depositing metal films and other vapor deposited materials by chemical reaction, typically a reduction reaction, and/or thermopyrolysis of the reacting gas. Alternative chemical vapor deposition processes are low pressure systems where reaction takes place at subatmospheric pressure. In addition, plasma-assisted chemical vapor deposition techniques, where lower deposition temperatures are utilized, can be performed in the apparatus of this invention. Alternative uses of the apparatus will be apparent to those skilled in the art from the detailed description herein.

The means for isolating the depositing surface of a substrate from undesirable radiation is more commonly a filter or reflector disposed between the source of radiation and the substrate. Other means which achieve these desired objects, such as an absorbing atmosphere which absorbs the undesired radiation prior to impingement upon the substrate surface, are also considered to be within the scope of this invention. The filters and/or reflectors utilized are dependent on the type of radiation which is to be isolated from the substrate surface. Different filters or reflectors are utilized depending on whether infrared radiation, ultraviolet light radiation, RF radiation or visible light radiation is to be isolated from the surface. The filters utilized are opaque to the undesired radiation. For example, graphite serves as a suitable filter for radiation in the RF range whereas quartz is transparent to such radiation and is unsuitable.

In selecting a particular filter or reflector, it may be desirable to have the filter material transparent to other forms of radiation. For example, where quartz is transparent to RF radiation and visible light radiation, it does absorb infrared radiation. As shown in the accompanying examples, isolating the depositing surface of the substrate from infrared radiation is useful in enhancing selectivity. In selecting an infrared filter, many materials are suitable including gases, solids, and liquids. However, the selection is narrower where it is desirable to have the filter transparent to other forms of radiation, such as RF and visible light. Another factor which limits the selection of materials is that the filter will emit infrared radiation after a significant quantity of radiation is absorbed. This necessitates replacement of the filter or filter material. Where the materials are solid, this can be quite inconvenient. Filters comprised of liquid materials, such as water within a water jacket, are much easier to handle and can be replenished continuously so as not to emit infrared radiation. Although gas filters can be replenished, the higher density of liquids permits smaller volumes to be utilized. Water filters are transparent to visible light radiation, and are preferred for cold wall reactor applications.

The configuration and location of the filters and/or reflectors is dependent on the reactor system utilized. Where an external radiant energy source is utilized to heat the substrate surface or susceptor within the reactor, a filter disposed outside of the reaction chamber is typically utilized. Where the substrate is heated by a resistance heater within the reaction chamber, reflectors positioned within the reaction chamber are more conveniently utilized. Typical reflective materials for infrared radiation include metals such as gold. It is to be understood that other configurations are possible and the apparatus comprising this invention is not limited to those described above.

Referring to the embodiment shown in FIG. 1, it should be understood that the chemical vapor deposition apparatus is shown in generally schematic fashion. The elements illustrated are typically within a surrounded enclosure in which the necessary gaseous reactant flow controls, electrical power sources, and other attendant mechanisms are housed and mounted. Such an enclosure is for safety purposes only and is not necessary for the remaining elements to provide the desired objects. The portions of the apparatus illustrated can be supported within such an enclosure in any suitable fashion.

The reaction chamber of the chemical deposition apparatus wherein deposition takes place is generally designated 5. The reaction chamber illustrated comprises an elongated enclosed tubular structure formed from a material which is transparent to the radiant energy generated by source 7, described more particularly below. The reaction chamber preferably has its walls formed of quartz, which is transparent to radiant energy in the wavelength range of one micron or below and RF frequencies. A suitable dimension for the tubular structure is one having a width of 6 inches with a length of about 20 inches, but the dimensions thereof may vary according to the production needs. In addition to the dimensions, the shape of the reactor may also vary within a wide range. The tubular structure illustrated is generally circular in cross-sectional area. As shown in FIG. 1, one end of the reaction chamber forms exhaust port 15 which is, in turn, connected to an exhaust system 20 so that spent reaction gases may be withdrawn from the reactor. Exhaust system 20 comprises a vacuum pump 1 and absorption trap 3 to collect by products. At its opposite end, gaseous reactants to be employed in a coating procedure are introduced into the reaction chamber through means, which in the embodiment illustrated, comprise a pair of conduits 9 and 10 which pass through a manifold 8 which seals off the reactor with backplate 11. These conduits terminate within the reaction chamber permitting gaseous reactants to emanate therefrom. It should be understood that a particular means chosen for introducing the gaseous reactants into the reaction chamber may be varied to meet particular manufacturing and production requirements. A slideable door 18 permits access to the interior of the reaction chamber. Access to the hollow interior through the end of the reaction chamber is necessary so that substrates to be coated can be loaded and unloaded therefrom prior to and following deposition thereon. To control the flow of gaseous reactants over the substrates (and prevent impurities from entering the reactor during shut down), a nitrogen backfill inlet 4 may be used in exhaust port 15 to supply nitrogen to the system.

The means for heating the substrate surface in the embodiment illustrated in FIG. 1 is a radiant energy source designated 7. The radiant energy source comprises at least one incandescent lamp capable of producing and transmitting radiant energy in the visible range, preferably wavelengths of about one micron of less. In the embodiment illustrated, the radiant energy source comprises a number of such lamps, which surround the reaction chamber. The lamps can be supported by any suitable means and are typically mounted in sockets, the electrical connections to which are not illustrated. Conventional electrical connections can be utilized, however. The lamps preferably employed within the present apparatus are high intensity tungsten filament lamps having a transparent quartz envelope. Such lamps are better known as conventional projector bulbs and are produced by General Electric Company under the name Multi-Mirror Projection Lamp, model ENH. Although the lamps employed in the embodiment of FIG. 1 are mounted to radiate at an angle approximately perpendicular to the silicon wafer and to the reaction chamber, any number of configurations may be suitable.

Also illustrated in FIG. 1 is a quartz water filter designated 6. This quartz water filter is positioned between the reaction chamber and the tungsten filament lamps. It comprises two layers of quartz which form a cavity for retaining water. Other configurations of water filters are possible and are considered within the scope of this invention. The quartz water filter illustrated is fed with water through conduit 50 which exits through conduit 51. A suitable dimension for the water filters is one which extends across the length of the radiant energy source having a width and length of about 10 inches and a thickness of about 1 inch.

An optional element for this configuration is a susceptor, not shown in FIG. 1. The susceptor can be used to support the substrates, such as silicon wafers in the reactor. It is formed of the material opaque to the radiant energy emitted from the chief source, such as an RF source, or visible light source. It emits radiant energy to provide uniform heating of the wafers positioned thereon. Use of a susceptor is not particularly desirable in the apparatus illustrated in FIG. 1 since the susceptor may generate undesirable infrared radiation within the reaction chamber. Reflectors or filters must be positioned within the reaction chamber to isolate the depositing surface from the infrared radiation generated. The apparatus illustrated in FIG. 2 has a configuration more suitable for the use of a susceptor.

Figure 2:
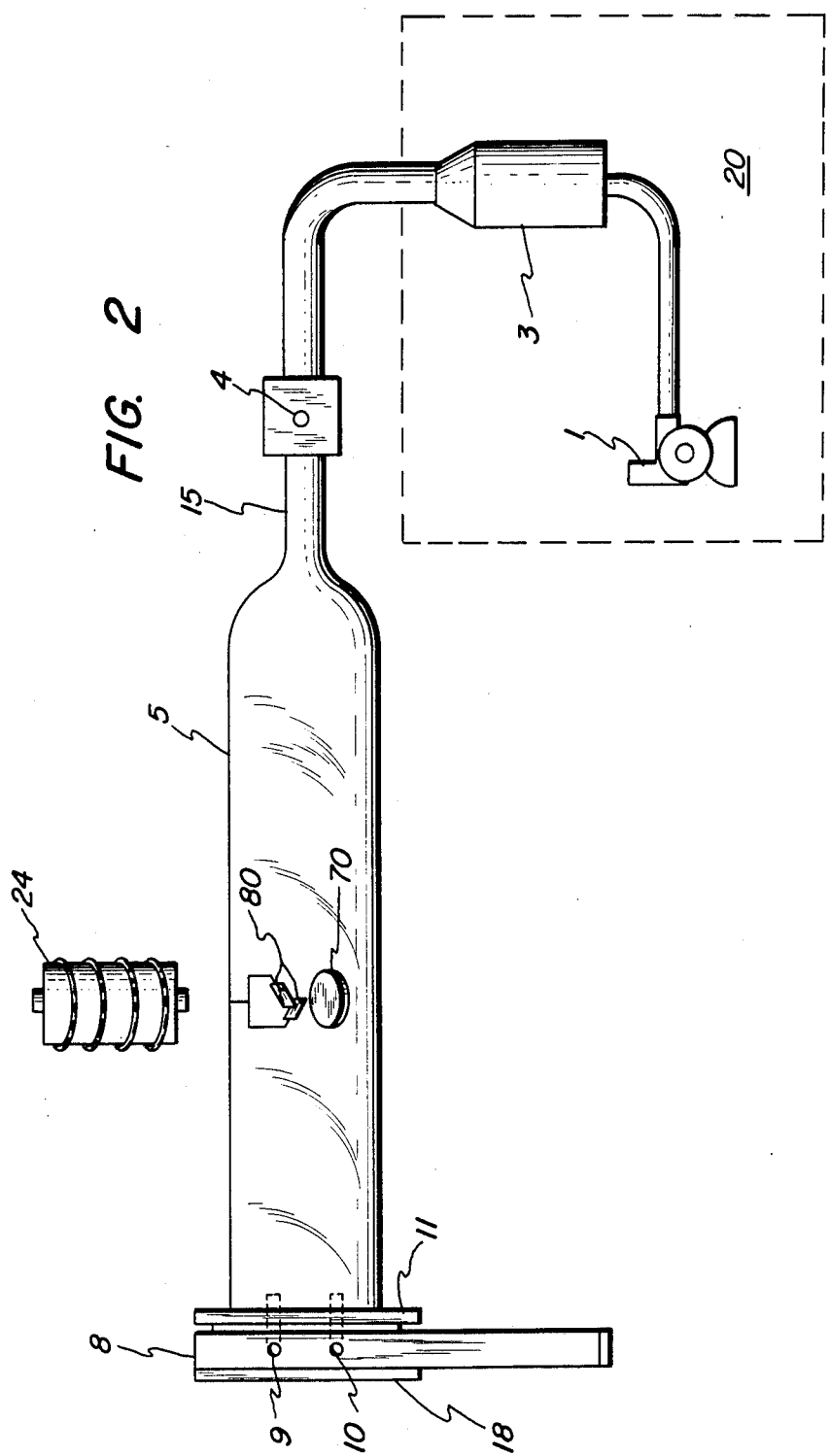
FIG. 2 is a schematic representation of a chemical vapor deposition apparatus of this invention which utilizes a radio frequency energy source coupled with a susceptor.

The embodiment illustrated in FIG. 2 is a cold-wall system which utilizes an RF frequency as a radiant energy source. Reaction chamber 5 is the same as that illustrated in FIG. 1. It is generally an elongated, enclosed, tubular structure formed of a material which is transparent to RF radiation generated by the RF source 24, described more particularly below. The reaction chamber is preferably comprised of quartz, which is transparent to radiant energy in the RF range. The dimensions of the chamber are similar to those of FIG. 1 being of about 6 inches in diameter with an overall length of about 20 inches, but the dimensions thereof may vary according to the production needs. The shape of the reactor may also vary within a wide range. As in the apparatus shown in FIG. 1, the reaction chamber forms an exhaust port 15 which is connected to exhaust system 20. The exhaust system is comprised of a similar vacuum pump 1 and absorption trap 3. The gaseous reactants are introduced into the reaction chamber through conduits 9 and 10 which pass through manifold 8 which seals off the reaction chamber with backplate 11. The radiant energy source 24, i.e. the RF source, generates and transmits a wave length in the range of about 0.1 to 100 meters. Any number of configurations are suitable for the RF source 24 provided the radiation transmitted will impinge a susceptor 70 positioned within the reaction chamber. In the embodiment described within FIG. 2, the RF generator is shown perpendicular to the silicon wafer and susceptor. Since the silicon wafer is typically transparent to RF radiation, the susceptor is a necessary element in this embodiment. The susceptor is positioned beneath the silicon wafer so as to contact only the non-depositing surface of the silicon wafer. For such a configuration, infrared radiation generated by the susceptor impinges only the non-depositing surface of the silicon wafer. The susceptor is preferably comprised of graphite, which readily absorbs and conducts radiant heat energy from the RF frequencies at short wave lengths.

Reflectors 80 are positioned within the reactor so as to deflect foreign infrared radiation generated within the reaction chamber. These reflectors are preferably comprised of gold. Since gold is not transparent to RF radiation, it is preferable to position the reflectors well above the depositing surface of the silicon waver. However, the configuration of the reflectors can vary widely.

Figure 3:
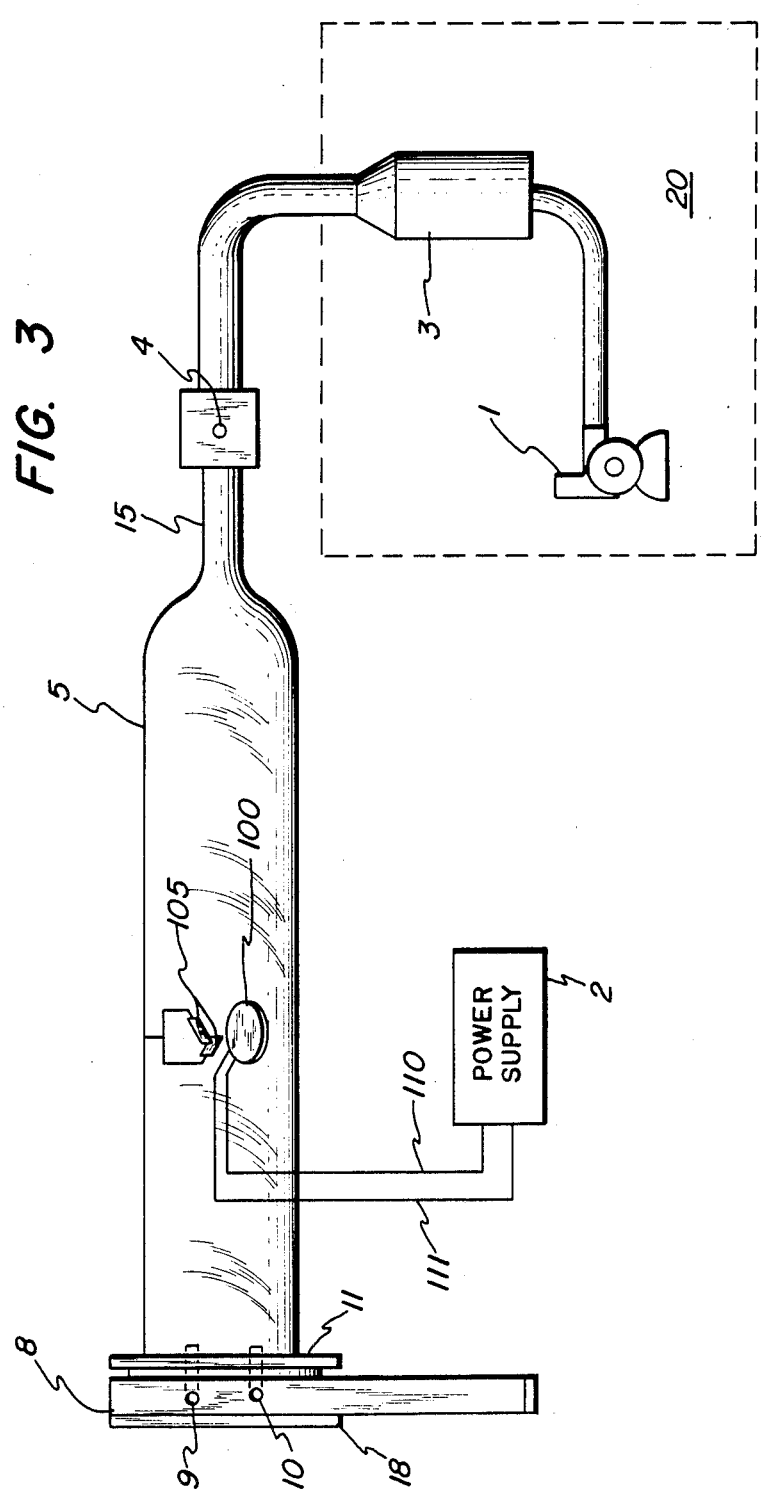
FIG. 3 is a schematic representation of a chemical vapor deposition apparatus of this invention which utilizes a resistance heater as an energy source.

FIG. 3 illustrates an alternative embodiment of this invention wherein the silicon wafer is heated within the reaction chamber by a resistance heater. Reaction chamber 5 is as described in FIGS. 1 and 2. The particular feature of this reaction chamber are not repeated here for the sake of brevity. Common reference numerals of FIGS. 1, 2 and 3 label similar elements. Resistance heat source 100 is positioned within the reaction chamber and is similar to the susceptor utilized in FIG. 2. It is powered by leads 110 and 111. The resistance heater contacts only the non-depositing surfaces of the silicon wafer. This avoids direct impingement of the infrared radiation generated by the resistant heater onto the depositing surface of said silicon wafer. Reflectors 105 are positioned within the reaction chamber so as to prevent stray infrared radiation from impinging on the depositing surface of the silicon wafer. These reflectors function in a similar manner to those described in FIG. 2. It should be understood that reflectors are not required in such an apparatus and that a filter may provide the same function. For example, coating the inside surface of the reactor with an infrared absorbing layer and cooling the surface with a water jacket will serve to isolate the depositing surface of the silicon wafer from stray infrared radiation by absorbing such radiation. The resistance heater 100 can be of any type which is inert to the reactant gases that are passed through said reaction chamber. The resistance heater typically must provide a temperature in the range of about 100° C. to 700° C. It is preferable to utilize a resistance heater which has a configuration that conforms to the profile of the silicon wafers or other substrates utilized.

The apparatus of this invention may be operated in either a "static mode", in which the chamber is closed off during deposition, or a "dynamic mode", in which a continuous flow of reactant deposition gas is passed through the chamber. The gas is preferably deposited in a dynamic mode to achieve thick films of the depositing material.

The process of this invention is directed to the selective deposition of metals on semiconductor and metal surfaces. It is based on conventional processes for the vapor deposition of metals coupled with the distinguishing feature of isolating the depositing surface of the substrate from infrared radiation during reaction of the gaseous reactant.

The metal to be deposited is preferably tungsten or molybdenum. To obtain thick films of these metals, the gaseous reactant is reduced with a reducing atmosphere such as hydrogen. Suitable depositing gases for molybdenum and tungsten include $WF_6$, $W(CO)_6$, $MoF_6$, $MoCl_5$, $Mo(CO)_6$ and the like. The reduction reaction takes place at a temperature about about 200° C. The preferred temperature falls within the range of about 250° to 650° C. and the total pressure within the reactant is preferably within the range of 0.1 to 2 Torr. The preferred gaseous reactant is tungsten hexafluoride, which can be conveniently reduced with hydrogen. Preferred mixtures of these constituents provide a hydrogen to tungsten hexafluoride ratio in the range of 3–50. The throughput rate for such reaction mixtures preferably falls within the range of 0.1 to 2 liters per minute.

Radiant energy which heats the substrate can be of any wave length, including infrared radiation, provided that the infrared radiation does not impinge the depositing surface of the substrate. This can be accomplished with any of the embodiments for the apparatus provided by this invention.

It is preferable to utilize an apparatus wherein the radiant energy source is external to the reaction chamber, such as a filament lamp or radio frequency generator, with filament lamps being most preferred. Where these filament lamps are used, the radiation which heats the substrate is principally within the visible light range. Such radiation can impinge the surface of the substrate without affecting the selectivity of metal deposition on the metal and semiconductor surfaces. Where the radiant energy source is external to the reactor, particularly where filament lamps are used, it is preferable to filter the infrared radiation to protect the substrate surface. This can be achieved outside the reactor with a water filter as described more particularly above. Such a system is preferred since it is much easier to absorb the infrared radiation than to reflect such radiation.

The substrates on which deposition takes place contain metal and semiconductor surfaces. They are most often silicon wafers with an integrated circuit pattern of insulators, metals and semiconductors. The insulator surfaces are typically $SiO_2$ and/or $Si_3N_4$ and the semiconductor surfaces are silicon. The metals can include platinum, molybdenum, titanium, tungsten, tantalum, aluminum and the like. Also included are the silicides of such metals described more particularly below.

To perform this process efficiently, the silicon wafers are first loaded into a chemical vapor deposition apparatus. The reaction chamber of such an apparatus is typically at a reduced pressure, i.e. below one atmosphere. Next, the silicon wafer is heated to the desired deposition temperature with radiant energy. The gaseous reactant/hydrogen mixture is then passed over the silicon wafer and metal deposition commences on the surfaces. The wafer is isolated from a substantial portion of impinging infrared radiation while the wafer is contacted with the depositing gas.

It will be understood that while the following examples primarily involve selective deposition of tungsten, the apparatus of the present invention is applicable to deposition of a wide variety of metallic compounds from a large number of deposition gases. The gases considered most useful for deposition in the context of the apparatus of the present invention are, without limitation: $Mo(CO)_6$, $W(CO)_6$, $Cr(CO)_6$, $Co(NO)_3(CO)_3$, $WF_6$, $MoF_6$, $MoCl_5$, etc. In addition, although the examples are primarily directed to deposition on silicon surfaces, the apparatus of the present invention is applicable to deposition on a wide variety of conductor and semiconductor surfaces. Suitable conductor surfaces are those provided by metals and alloys thereof including, for example, platinum, molybdenum, titanium, tungsten, tantalum, aluminum, and the like, including mixtures thereof. Other suitable conductors include transition metal silicides, such as tungsten silicide, molybdenum silicide, titanium silicide, titanium silicide, platinum silicide, and the like.

The following examples are provided to illustrate the particular embodiments of this invention. These examples are not provided with the intention of limiting the scope of this invention to the embodiments disclosed.

EXAMPLES 1-5

In each of Examples 1-5, a silicon wafer covered by an insulator surface of silicon dioxide (9000 Angstroms) with openings etched to expose the underlying silicon was used. Each of the wafers were placed in a reactor as shown in FIG. 1. Tungsten filament Projection lamps (GE ENH) were utilized to heat the surface of the silicon wafer in each example. Four bulbs were positioned parallel to the reaction chamber on each side of the reactor. Two quartz water jackets were positioned on each side of the reaction chamber between the bulbs and the reactor. Water was passed through the water jackets at a rate of about one liter per minute for each example. Upon heating the silicon wafer to the temperature indicated in Table I below, a gas mixture of tungsten hexafluoride and hydrogen was passed over the wafer. The molar ratio of hydrogen to tungsten hexafluoride, the duration of the reaction, the pressure within the reaction chamber and the throughput rate for each example are indicated in Table I. Upon removal from the furnace, the wafers showed no deposition of tungsten on the insulator surfaces and provided a tungsten metal film on the semiconductive surface having an approximate thickness as indicated in Table I. The corresponding growth rate for each example is also provided in Table I.

TABLE I

| Example | Temp. (C.°) | Press. (Torr) | Mole Ratio | Flow Rate (SCCM) | Time (Min.) | Thickness (Å) | Growth Rate (Å/min) |
|---|---|---|---|---|---|---|---|
| 1 | 350 | .60 | 30 | 310 | 20 | 10000 | 500 |
| 2 | 520 | .60 | 30 | 310 | 3 | 10500 | 3500 |
| 3 | 330 | .60 | 30 | 310 | 10 | 4500 | 450 |
| 4 | 365 | .30 | 15 | 160 | 20 | 6000 | 300 |
| 5 | 330 | .80 | 45 | 460 | 20 | 7000 | 350 |

For comparative results, the reaction chamber used in Example 1 was loaded with a similar silicon wafer having insulator surfaces of silicon dioxide (9000 Angstroms) and semiconductor surfaces of silicon. The silicon wafer was heated in a manner similar to that of Example 1 in that 8 tungsten filament lamps were disposed about the reaction chamber. No quartz water jackets were used to filter the undesired radiation from the tungsten filament lamps. Upon heating the silicon wafer to a temperature of about 350° C., a gas mixture of tungsten hexafluoride and hydrogen was passed over the wafer for approximately twenty minutes. The molar ratio of tungsten hexafluoride to hydrogen fell within the range of about 1:30. Upon removal from the furnace, the wafer showed deposition of one micron of tungsten on the silicon surface. In addition, however, some deposition of tungsten also occurred on the silicon dioxide surface.

What is claimed is:

1. A chemical vapor deposition apparatus for depositing materials on a substrate which comprises a cold-wall reaction chamber, a means for heating the substrate to a temperature above 100° C. and a means for transporting a gaseous reactant to the substrate surface, the improvement comprising:
   a means for substantially isolating the depositing surface of a substrate comprising metal surfaces, semiconductor surfaces, or both, from impinging infrared radiation which comprises a means disposed within said cold wall reaction chamber for substantially isolating said depositing surface from infrared radiation generated within said cold wall reaction chamber.

2. An apparatus as in claim 1 wherein the means for heating the substrate above 100° C. is internal to said cold wall reaction chamber.

3. An apparatus as in claim 2 wherein the means for substantially isolating impinging infrared radiation from the depositing surface of said substrate is an infrared reflector disposed within the cold wall reaction chamber.

4. An apparatus as in claim 2 wherein the means for substantially isolating impinging infrared radiation from the depositing surface of the substrate is an infrared filter disposed within the cold wall reaction chamber.

5. An apparatus as in claim 4 wherein the infrared filter is a solid.

6. An apparatus as in claim 2 wherein the means for heating the substrate above 100° C. comprises a susceptor within the reaction chamber which transmits radiant energy to the non-depositing surface of the silicon wafer and a means for heating the susceptor.

7. An apparatus as in claim 6 wherein the means for isolating undesirable radiation from the depositing surface of the silicon wafer is an infrared absorbing surface coated on the inside surface of the reaction chamber which is cooled by a surrounding water jacket.

8. An apparatus as in claim 6 wherein the susceptor is opaque to radio frequencies and the means for heating the susceptor is a radio frequency generator.

9. An apparatus as in claim 1 adapted to deposit materials on a substrate consisting of a silicon wafer with an integrated circuit pattern having surfaces provided by materials selected from the group consisting of insulators, metals and semiconductors.

10. An apparatus as in claim 1 adapted to deposit a metal on a substrate.

11. An apparatus as in claim 10 adapted to deposit a metal selected from the group consisting of tungsten and molybdenum.

12. An apparatus as in claim 1 wherein the means for heating the substrate above 100° C. is a radiant energy source external to the reaction chamber.

13. An apparatus as in claim 1 wherein the means for substantially isolating the depositing surface of the substrate from infrared radiation comprises (1) a filter disposed outside of said cold wall reaction chamber and (2) a means disposed within said cold wall reaction chamber for substantially isolating the depositing surface from infrared radiation generated within said cold wall reaction chamber.

14. An apparatus as in claim 13 wherein the radiant energy source is one or more filament lamps.

15. An apparatus as in claim 13 wherein said filter is a water jacket.

16. An apparatus as in claim 15 wherein said filter is disposed within the wall of the reaction chamber where deposition takes place.

17. An apparatus as in claim 13 wherein a solid infrared filter disposed within the cold wall reaction chamber isolates the depositing surface from infrared radiation generated within the cold wall reaction chamber.

18. An apparatus as in claim 1 wherein the means for heating the substrate above 100° C. is a resistance heater positioned within the reaction chamber.

* * * * *